(12) United States Patent
Arai et al.

(10) Patent No.: US 12,091,531 B2
(45) Date of Patent: Sep. 17, 2024

(54) COPOLYMER AND LAMINATE CONTAINING SAME

(71) Applicant: DENKA COMPANY LIMITED, Tokyo (JP)

(72) Inventors: Toru Arai, Tokyo (JP); Shota Yamamoto, Tokyo (JP); Hiroaki Nishimura, Tokyo (JP); Azusa Yagi, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 17/781,499

(22) PCT Filed: Dec. 1, 2020

(86) PCT No.: PCT/JP2020/044699
§ 371 (c)(1),
(2) Date: Jun. 1, 2022

(87) PCT Pub. No.: WO2021/112087
PCT Pub. Date: Jun. 10, 2021

(65) Prior Publication Data
US 2023/0023832 A1    Jan. 26, 2023

(30) Foreign Application Priority Data

| Dec. 3, 2019 | (JP) | 2019-218685 |
| Dec. 3, 2019 | (JP) | 2019-218686 |
| May 20, 2020 | (JP) | 2020-088490 |
| May 20, 2020 | (JP) | 2020-088491 |
| May 20, 2020 | (JP) | 2020-088492 |
| May 20, 2020 | (JP) | 2020-088493 |

(51) Int. Cl.
| C08L 23/08 | (2006.01) |
| B32B 7/12 | (2006.01) |
| B32B 15/082 | (2006.01) |
| B32B 15/085 | (2006.01) |
| B32B 15/20 | (2006.01) |
| B32B 17/10 | (2006.01) |
| B32B 27/08 | (2006.01) |
| B32B 27/32 | (2006.01) |
| C08F 210/02 | (2006.01) |
| C08F 212/08 | (2006.01) |
| C08F 212/36 | (2006.01) |
| C08K 5/14 | (2006.01) |
| C08L 25/08 | (2006.01) |

(52) U.S. Cl.
CPC ............ *C08L 23/0838* (2013.01); *B32B 7/12* (2013.01); *B32B 15/082* (2013.01); *B32B 15/085* (2013.01); *B32B 15/20* (2013.01); *B32B 17/10* (2013.01); *B32B 27/08* (2013.01); *B32B 27/322* (2013.01); *C08F 210/02* (2013.01); *C08F 212/08* (2013.01); *C08F 212/36* (2013.01); *C08K 5/14* (2013.01); *C08L 25/08* (2013.01); *B32B 2307/204* (2013.01); *B32B 2307/206* (2013.01); *B32B 2307/54* (2013.01); *B32B 2307/732* (2013.01); *B32B 2307/748* (2013.01); *B32B 2311/12* (2013.01); *B32B 2323/04* (2013.01); *B32B 2325/00* (2013.01)

(58) Field of Classification Search
None
See application file for complete search history.

(56) References Cited

U.S. PATENT DOCUMENTS

| 6,265,493 B1 | 7/2001 | Chung et al. | |
| 6,500,535 B1 * | 12/2002 | Yamada | C08L 53/00 525/324 |
| 6,559,234 B1 * | 5/2003 | Arai | C08J 9/06 526/170 |
| 9,439,303 B2 | 9/2016 | Onodera et al. | |

(Continued)

FOREIGN PATENT DOCUMENTS

| EP | 4 183 843 A1 | 5/2023 |
| JP | S52-031272 B2 | 8/1977 |

(Continued)

OTHER PUBLICATIONS

Suzuki—JP 2002-265543 A—MT—sealant w—copolymer—2002 (Year: 2002).*

(Continued)

*Primary Examiner* — John Vincent Lawler

(74) *Attorney, Agent, or Firm* — Oliff PLC

(57) ABSTRACT

A laminate has an olefin-aromatic vinyl compound-aromatic polyene copolymer and a metal foil. The number average molecular copolymer weight is between 5000 and 100000; the aromatic vinyl compound monomer is aromatic vinyl compound having between 8 and 20 carbon atoms, and the aromatic vinyl compound monomer unit content is between 10 and 60 mass %; the aromatic polyene is selected having between 5 and 20 carbon atoms and vinyl and/or vinylene groups in the molecule, the content derived from the aromatic polyene unit is between 1.5 and 20 pieces per number average molecular weight; and the olefin is selected having between 2 and 20 carbon atoms, being ethylene alone, or having a mass ratio of α-olefin monomer components other than ethylene to an ethylene monomer component contained in the olefin, of ½ or less, and the total monomer units of the olefin, aromatic vinyl compound, and aromatic polyene is 100 mass %.

16 Claims, No Drawings

(56) References Cited

U.S. PATENT DOCUMENTS

| | | |
|---|---|---|
| 2004/0039127 A1 | 2/2004 | Amou et al. |
| 2009/0263604 A1 | 10/2009 | Arai et al. |
| 2010/0129676 A1 | 5/2010 | Fujimoto et al. |
| 2015/0195921 A1* | 7/2015 | Onodera ............ H05K 3/4691 |
| | | 174/258 |
| 2016/0212845 A1 | 7/2016 | Nakashima et al. |
| 2016/0289437 A1 | 10/2016 | Kumagai et al. |
| 2017/0145135 A1* | 5/2017 | Arai .................... C08F 212/00 |
| 2017/0190837 A1 | 7/2017 | Hsieh et al. |
| 2018/0009195 A1 | 1/2018 | Takeuchi et al. |
| 2018/0273669 A1* | 9/2018 | Arai .................... C08F 297/02 |
| 2020/0157261 A1 | 5/2020 | Guan et al. |
| 2021/0070980 A1 | 3/2021 | Zeng et al. |
| 2022/0105707 A1 | 4/2022 | Inoda et al. |

FOREIGN PATENT DOCUMENTS

| | | | | |
|---|---|---|---|---|
| JP | H06-192392 | A | | 7/1994 |
| JP | H11-060645 | A | | 3/1999 |
| JP | 2002/265543 | | * | 9/2002 ............ B32B 27/30 |
| JP | 2003-212941 | A | | 7/2003 |
| JP | 2004-087639 | A | | 3/2004 |
| JP | 2005-089631 | A | | 4/2005 |
| JP | 2006/176708 | | * | 7/2006 |
| JP | 2006-176708 | A | | 7/2006 |
| JP | 2008-291227 | A | | 12/2008 |
| JP | 2009/161743 | | * | 7/2009 |
| JP | 2009-161743 | A | | 7/2009 |
| JP | 2010/013575 | | * | 1/2010 ............ C08L 53/00 |
| JP | 2010/280771 | | * | 12/2010 ............ C08F 2/44 |
| JP | 2010-280771 | A | | 12/2010 |
| JP | 2010-280860 | A | | 12/2010 |
| JP | 2011-074187 | A | | 4/2011 |
| JP | 2012-102173 | A | | 5/2012 |
| JP | 5336935 | B2 | | 11/2013 |
| JP | 5481098 | B2 | | 4/2014 |
| JP | 2018-039995 | A | | 3/2018 |
| TW | I590722 | B | | 7/2017 |
| WO | 00/37517 | A1 | | 6/2000 |
| WO | 2015/050080 | A1 | | 4/2015 |
| WO | 2016/114287 | A1 | | 7/2016 |
| WO | 2019/024254 | A1 | | 2/2019 |
| WO | 2019/024255 | A1 | | 2/2019 |
| WO | 2020/153391 | A1 | | 7/2020 |
| WO | 2022/014599 | A1 | | 1/2022 |

OTHER PUBLICATIONS

Arai—JP 2006-176708 A—MT—copolymer w—up to 3% divinylbenzene—2006 (Year: 2006).*
Arai—JP 2009-161743 A—Euro D1—MT—copolymer low dielectric curing resin—2009 (Year: 2009).*
Aria—JP 2010-280771 A—Euro D2—MT—copolymer low dielectric curing comp—2010 (Year: 2010).*
Suzuki—JP 2010-013575 A—MT—styrene-ethylene-divinylbenzene copolymer—small amounts DVB—2010 (Year: 2010).*
Feb. 2, 2021 Search Report issued in International Patent Application No. PCT/JP2020/044699.
Feb. 16, 2021 Search Report issued in International Patent Application No. PCT/JP2020/044700.
U.S. Appl. No. 17/782,000, filed Jun. 2, 2022 in the name of Toru Arai et al.
May 17, 2022 International Preliminary Report on Patentability issued in International Patent Application No. PCT/JP2020/044700.
May 17, 2022 International Preliminary Report on Patentability issued in International Patent Application No. PCT/JP2020/044699.
Jan. 4, 2023 Extended European Search Report issued in European Patent Application No. 20897253.9.
Jan. 4, 2023 Extended European Search Report issued in Europeant Patent Application No. 22202823.5.
Oct. 11, 2023 Office Action issued in U.S. Appl. No. 17/782,000.
Dec. 4, 2023 Office Action issued in Chinese Patent Application No. 202080082954.5.
Dec. 4, 2023 Office Action issued in Japanese Patent Application No. 202080082954.5.
Jan. 23, 2024 Office Action issued in U.S. Appl. No. 17/782,000.
Jan. 20, 2024 Office Action issued in Chinese Patent Application No. 202080083049.1.
Jun. 12, 2024 Notice of Allowance issued on U.S. Appl. No. 17/782,000.

* cited by examiner

COPOLYMER AND LAMINATE CONTAINING SAME

TECHNICAL FIELD

The present invention relates to a copolymer, and also relates to a laminate including a resin layer containing the copolymer and a metal foil.

BACKGROUND ART

Due to the shift of communication frequency to gigahertz bands and frequency bands higher than those, needs for insulating materials having low dielectric properties have increased. Polyolefins such as polyethylene and aromatic vinyl compound polymers such as polystyrene are known as materials exhibiting excellent low dielectric constant and low dielectric tangent due to having no polar groups in molecular structures. However, due to dependence of the heat resistance on the melting point of crystals or the glass transition temperature, they have a problem in the heat resistance as electric insulator, and due to being thermoplastic resins, they have a problem in a film forming process (Patent Literature 1).

Although fluorine-based resins such as perfluoroethylene have characteristics excellent in low dielectric constant, low dielectric loss and heat resistance, device suitability is low due to difficulty in moldability and film formability. In addition, there is a problem in the adhesive strength with a copper foil of wiring. Meanwhile, although substrates and insulating materials using post-curable resins such as epoxy resins, unsaturated polyester resins, polyimide resins, and phenol resins have been widely used due to the heat resistance and easy handling, improvement is required as insulating materials for high frequencies due to relatively high dielectric constants and dielectric losses (Patent Literature 2).

An electrically insulating material including graft or block copolymer including olefin-based and styrene-based polymer segments has been proposed (Patent Literature 3). The material focuses on the low dielectric constant and low dielectric loss essential to olefin-based or styrene-based hydrocarbon polymers. The production method includes general graft polymerization of commercially available polyethylene and polypropylene with a styrene monomer or a divinylbenzene monomer in the presence of a radical polymerization initiator. Such a method has problems of poor graft efficiency and insufficient uniformity of the polymer. Further, the resulting polymer contains a gel, so that there exist problems of poor processability and filling property. The material is a thermoplastic resin having insufficient heat resistance, so that an addition of a heat-resistant resin such as 4-methyl-1-pentene is required. It is difficult to use the material in a molding method including applying the material to a predetermined place or filling a predetermined place with the material and then curing the material.

In Patent Literature 4, an insulating layer including a crosslinked structure containing a hydrocarbon compound having a plurality of aromatic vinyl groups as a cross-linking component is described. The cured material of the cross-linking component specifically described in examples is rigid, so that it is presumed that filling with a large amount of filler is difficult.

In Patent Literature 5, a cured material obtained from a specific polymerization catalyst, including an ethylene-olefin (aromatic vinyl compound)-polyene copolymer having specific composition and formulation and a non-polar vinyl compound copolymer, is shown. Although the cured material specifically described in examples of Patent Literature 5 has characteristics including low dielectric constant and low dielectric tangent, it is extremely soft, so that improvement in mechanical strength such as elastic modulus at normal temperature and high temperature is required. For use as thin film insulating materials such as interlayer insulating materials of FPC and FCCL and coverlay applications, it is preferable to improve stability in dimensions such as thickness during a mounting process or during use after mounting. Further, the cured material of the composition specifically described in examples has room for improvement in adhesion to a metal foil, particularly to a copper foil. In Patent Literature 6, a cured material obtained from the similar specific polymerization catalyst, including an ethylene-olefin (aromatic vinyl compound)-polyene copolymer having specific composition and formulation and a non-polar vinyl compound copolymer is shown. However, the cured material of the composition specifically described in examples has room for improvement in adhesion to a metal foil, particularly to a copper foil, and also in low temperature characteristics. Although a cured material of a composition containing a similar copolymer is also shown in Patent Literature 7, the cured material of the composition specifically described in examples has room for improvement in adhesion to a metal foil, particularly to a copper foil.

A curable composition disclosed in Patent Literature 5, 6, and 7 contains a relatively large amount of monomer components (aromatic vinyl compounds and aromatic polyenes) and are in a varnish form. Therefore, these curable compositions have a problem that a B stage sheet (Semi-cured sheet) may not be easily produced in addition to a problem of having an odor. These curable compositions have a problem of complicated production facilities.

CITATION LIST

Patent Literature

Patent Literature 1: Japanese Patent Publication No. 52-31272

Patent Literature 2: Japanese Patent Laid-Open No. 6-192392

Patent Literature 3: Japanese Patent Laid-Open No. 11-60645

Patent Literature 4: Japanese Patent Laid-Open No. 2004-087639

Patent Literature 5: Japanese Patent Laid-Open No. 2010-280771

Patent Literature 6: Japanese Patent Laid-Open No. 2009-161743

Patent Literature 7: Japanese Patent Laid-Open No. 2010-280860

SUMMARY OF INVENTION

Technical Problem

It is desired to provide a material from which a cured material having excellent low dielectric properties and mechanical properties with high adhesiveness to a metal foil is obtained, which has not been available by the conventional techniques described above.

Solution to Problem

In other words, the present invention may provide the following aspects.

A laminate comprising a resin layer containing an olefin-aromatic vinyl compound-aromatic polyene copolymer satisfying the following conditions (1) to (4) and a metal foil:

(1) The number average molecular weight of the copolymer is 5000 or more, preferably 20000 or more and 100000 or less;

(2) The aromatic vinyl compound monomer is an aromatic vinyl compound having 8 or more and 20 or less carbon atoms, and the content of the unit of the aromatic vinyl compound monomer is 10 mass % or more and less than 60 mass %;

(3) The aromatic polyene is one or more selected from polyenes having 5 or more and 20 or less carbon atoms and having a plurality of vinyl groups and/or vinylene groups in the molecule, and the content of the vinyl groups and/or the vinylene groups derived from the unit of the aromatic polyene is 1.5 pieces or more and less than 20 pieces per number average molecular weight; and (4) The olefin is one or more selected from olefins having 2 or more and 20 or less carbon atoms, being ethylene alone, or having a mass ratio of α-olefin monomer components other than ethylene to an ethylene monomer component contained in the olefin, of $1/7$ or less, and the total of units of the olefin monomer, the aromatic vinyl compound monomer, and the aromatic polyene monomer is 100 mass %.

An olefin-aromatic vinyl compound-aromatic polyene copolymer satisfies the following conditions (1) to (4):

(1) The number average molecular weight of the copolymer is 5000 or more, preferably 20000 or more and 100000 or less;

(2) The aromatic vinyl compound monomer is an aromatic vinyl compound having 8 or more and 20 or less carbon atoms, and the content of the aromatic vinyl compound monomer unit is 10 mass % or more and less than 60 mass %;

(3) The aromatic polyene is one or more selected from polyenes having 5 or more and 20 or less carbon atoms and having a plurality of vinyl groups and/or vinylene groups in the molecule, and the content of the vinyl groups and/or the vinylene groups derived from the unit of the aromatic polyene is 1.5 pieces or more and less than 20 pieces per number average molecular weight; and (4) The olefin is one or more selected from olefins having 2 or more and 20 or less carbon atoms, being ethylene alone, or having a mass ratio of α-olefin monomer components other than ethylene to an ethylene monomer component contained in the olefin, of $1/7$ or less, and the total of units of the olefin monomer, the aromatic vinyl compound monomer, and the aromatic polyene monomer is 100 mass %.

Advantageous Effect of Invention

A cured material (or cured product) of the laminate comprising a copolymer or a resin layer containing the copolymer and a metal foil of the present invention has high adhesiveness to the metal foil and excellent low dielectric properties, exhibiting high mechanical properties at normal temperature and high temperature.

DESCRIPTION OF EMBODIMENT

The present invention is described in more detail as follows. In the specification, a term "sheet" also includes the concept of a film. Further, a term "film" described in the specification also includes the concept of a sheet. A term "resin layer" described in the specification is a layer containing the composition of the present invention, and its shape is optional. Generally, the resin layer is in a sheet form, and the size in the horizontal direction and the thickness in the vertical direction relative to the metal foil are optional. The resin layer may also contain other materials contained in a known insulating layer, such as a filler and a flame retardant, or may be a fiber or non-woven fabric of glass or ceramic impregnated with the composition. Further, the shape thereof is optional, not limited to a sheet form, and may be a hemispherical shape or a striped shape as in the case of a potting material. In the present specification, the metal foil is a concept including wiring of the metal. The shape thereof is optional, and may be in a foil form, linear form, or dot form. As the metal foil, a commercially available metal foil may be used. Alternatively, the metal foil may be formed through an optional process such as vapor deposition and plating. Unless otherwise specified, the numerical range in the specification includes the upper limit value and the lower limit value of the range. In the specification, a content may be referred to as a content amount.

In the present specification, a laminate refers to a structure including at least the resin layer and the metal foil which are in contact and adhered to each other, and the lamination form is optional. Generally, at least the resin layer and the metal foil may be laminated in a layered state, and the number of layers is optional. The resin layer and the metal foil may be adjacent to each other, or may include another layer intervening. Examples of the laminate include CCL, FCCL, PC, FPC, etc.

Compositions

In the present specification, a composition may be referred to as a resin composition or a curable composition. The composition of the present invention contains the olefin-aromatic vinyl compound-aromatic polyene copolymer having a certain range of formulation and molecular weight ranges, and also may contain one or more selected from a "curing agent", a "monomer", an "additive resin", a "solvent", a "filler", a "flame retardant", and a "surface modifier".

Olefin-Aromatic Vinyl Compound-Aromatic Polyene Copolymer (Copolymer of Olefin Monomer, Aromatic Vinyl Compound Monomer, and Aromatic Polyene Monomer)

Methods for producing a general olefin-aromatic vinyl compound-aromatic polyene copolymer that may be used in the present invention are described in, for example, Japanese Patent Laid-Open No. 2009-161743, Japanese Patent Laid-Open No. 2010-280771 and International Publication No. WO 00/37517. The olefin-aromatic vinyl compound-aromatic polyene copolymer (hereinafter, may be simply referred to as "copolymer") satisfies all of the following conditions (1) to (4).

(1) The number average molecular weight of the copolymer is 5000 or more, preferably 20000 or more and 100000 or less;

(2) The aromatic vinyl compound monomer is an aromatic vinyl compound having 8 or more and 20 or less carbon atoms, and the content of the aromatic vinyl compound monomer unit is 10 mass % or more and less than 60 mass %;

(3) The aromatic polyene is one or more selected from polyenes having 5 or more and 20 or less carbon atoms and having a plurality of vinyl groups and/or vinylene groups in the molecule, and the content of the vinyl groups and/or the vinylene groups derived from the aromatic polyene unit is 1.5 pieces or more and less than 20 pieces per number average molecular weight; and (4) The olefin is one or more selected from olefins having 2 or more and 20 or less carbon atoms, being ethylene alone, or having a mass ratio of α-olefin monomer units other than ethylene to an ethylene monomer unit contained in olefin, of 1/7 or less, and the total of the olefin monomer unit, the aromatic vinyl compound monomer unit, and the aromatic polyene monomer unit is 100 mass %.

Further, the number average molecular weight of the copolymer is 5000 or more, preferably 20000 or more and 100000 or less, and still more preferably 30000 or more and 100000 or less.

The olefin-aromatic vinyl compound-aromatic polyene copolymer may be obtained by copolymerizing each of the monomers of an olefin, an aromatic vinyl compound, and an aromatic polyene.

In the copolymer, the content of the olefin monomer unit is preferably 35 mass % or more, and particularly preferably 45 mass % or more. The total of the olefin monomer unit, the aromatic vinyl compound monomer unit, and the aromatic polyene monomer unit is 100 mass %. With an olefin monomer unit content of 35 mass % or more, the toughness (elongation) of the finally resulting cured material is improved, resulting in no cracks during curing, no decrease in impact resistance of the cured material, and no occurrence of cracks of the cured material during a heat cycle test. In the copolymer, the preferred olefin monomer unit content is 90 mass % or less.

The olefin monomer is one or more selected from α-olefins having 2 or more and 20 or less carbon atoms and cyclic olefins having 5 or more and 20 or less carbon atoms, which is a compound composed of carbon and hydrogen, substantially containing no oxygen, nitrogen, or halogen. Examples of the α-olefins having 2 or more and 20 or less carbon atoms include ethylene, propylene, 1-butene, 1-hexene, 1-octene, 1-decane, 1-dodecane, 4-methyl-1-pentene, and 3,5,5-trimethyl-1-hexene. Examples of the cyclic olefin having 5 or more and 20 or less carbon atoms include norbornene and cyclopentene. The olefin is preferably a combination of ethylene and an α-olefin or a cyclic olefin other than ethylene, or ethylene alone. In the case where the olefin is ethylene alone, or the mass ratio of α-olefin monomer components to an ethylene monomer component contained in the olefin is 1/7 or less, more preferably 1/10 or less, the breaking strength (strength at break) and the breaking elongation (elongation at break) of the resulting cured material is increased, so that the peel strength from a copper foil or copper wiring may be favorably increased. More preferably, the content of the α-olefin monomer unit other than ethylene contained in the copolymer is 6 mass % or less, most preferably 4 mass % or less, or the olefin is ethylene alone. In this case, the peel strength from a copper foil or copper wiring may be further favorably increased. In a combination of ethylene and an α-olefin other than ethylene, the glass transition temperature of the ethylene-α-olefin-aromatic vinyl compound-aromatic polyene chain of the finally resulting cured material may be freely adjusted in the range of about −60° C. to −5° C., depending on the type and content of the α-olefin.

The aromatic vinyl compound monomer is an aromatic vinyl compound having 8 or more and 20 or less carbon atoms, and examples thereof include styrene, paramethylstyrene, paraisobutylstyrene, various vinylnaphthalenes, and various vinylanthracenes.

The aromatic polyene monomer is a polyene having 5 or more and 20 or less carbon atoms, preferably 8 or more and 20 or less carbon atoms, and having a plurality of vinyl groups and/or vinylene groups in the molecule. The aromatic polyene monomer is preferably a polyene having 8 or more and 20 or less carbon atoms and having a plurality of vinyl groups in the molecule, being more preferably various (ortho, meta, and para) divinylbenzenes or a mixture thereof, and a compound composed of carbon and hydrogen, substantially containing no oxygen, nitrogen, or halogen, having an aromatic vinyl structure such as divinylnaphthalene, divinylanthracene, p-2-propenylstyrene, and p-3-butenylstyrene. Alternatively, a bifunctional aromatic vinyl compound described in Japanese Patent Laid-Open No. 2004-087639, for example, 1,2-bis(vinylphenyl)ethane (abbreviation: BVPE) may be used. Among these, various (ortho, meta and para) divinylbenzenes, or mixtures thereof are preferably used, and a mixture of meta and paradivinylbenzene is most preferably used. In the specification, these are referred to as divinylbenzenes. Use of divinylbenzenes as the aromatic polyene is preferred, because the curing efficiency is high in a curing process to achieve easy curing.

Each of the monomers of the olefin, aromatic vinyl compound, and aromatic polyene may further include an olefin containing a polar group such as an oxygen atom, a nitrogen atom, etc., an aromatic vinyl compound containing an oxygen atom, a nitrogen atom, etc., or an aromatic polyene containing an oxygen atom, a nitrogen atom, etc. However, the total mass of the monomers containing these polar groups is preferably 10 mass % or less, more preferably 3 mass % or less, relative to the total mass of the composition, and it is most preferable that no monomers containing a polar group be contained. By setting the content to 10 mass % or less, the low dielectric property (low dielectric constant/low dielectric loss) of the cured material obtained by curing the composition may be improved.

The number average molecular weight of the copolymer is 5000 or more, preferably 20000 or more and 100000 or less, and particularly preferably 30000 or more and 100000 or less. With a number average molecular weight of 5000 or more, preferably 20000 or more, good physical properties such as high strength at break and high elongation at break may be easily imparted to a finally resulting cured material, which is preferred as toughness is easily imparted. Specifically, it is preferable that the tensile elongation at break (tensile breaking elongation) be 30% or more. With a number average molecular weight of 20000 or more, the composition in an uncured state is not sticky and an effect for improving thermoplasticity may be obtained. With a number average molecular weight of higher than 100000, moldability of the composition before curing may become difficult. The content of the aromatic vinyl compound monomer unit in the copolymer is 10 mass % or more and less than 60 mass %. With a content of the aromatic vinyl compound monomer unit of 60 mass % or more, the glass transition temperature of the finally resulting cured material of the composition is in the vicinity of room temperature, and the toughness at low temperatures may decrease. Alternatively, the elongation may decrease, which is not preferred. With a content of the aromatic vinyl compound monomer unit of 60 mass % or more, the peel strength from a copper foil may decrease in comparison with a content of less than 60 mass %. The content of the aromatic vinyl compound monomer unit contained in the copolymer is particularly preferably 10 mass % or more and 55 mass % or less. With a content of the aromatic vinyl compound monomer unit of less than 10 mass %, the aromaticity of the copolymer decreases and the compatibility with a flame retardant and a filler is worsened, which may cause bleeding out of the flame retardant and difficulty in filling with the filler. Further, with a content of the aromatic vinyl compound monomer unit of 10 mass % or more, a cured material of the composition having high peel strength from a metal foil (particularly a copper foil) or copper wiring may be obtained.

In the copolymer, the content of the vinyl group and/or vinylene group derived from an aromatic polyene unit (hereinafter, a content may be referred to as a content amount) is 1.5 pieces or more and less than 20 pieces, preferably 3 pieces or more and less than 20 pieces, per number average molecular weight of the copolymer. With less than 1.5 pieces, the cross-linking efficiency is low, and it may become difficult to increase storage elastic modulus at high temperature. The content of vinyl group and/or vinylene group may be collectively referred to as "vinyl group content". With the vinyl group content controlled in the range, while maintaining or improving the mechanical properties such as breaking strength and breaking elongation at normal temperature, the cross-linking efficiency and cross-linking density may be increased, favorably resulting in easy increase in the storage elastic modulus at high temperature. In particular, in the case where the amount of monomers used is relatively low, the effect is remarkable. The content of the vinyl group derived from the aromatic polyene unit (divinylbenzene unit) per number average molecular weight in the copolymer may be obtained by comparing the number average molecular weight (Mn) in terms of standard polystyrene obtained by GPC (gel permeation chromatography) method known to those skilled in the art with the vinyl group content and the vinylene group content derived from the aromatic polymer unit obtained by $^1$H-NMR measurement. As an example, in the case where the vinyl group content derived from the aromatic polyene unit in the copolymer is 0.095 mass % resulting from comparison of the intensity of each peak area obtained by $^1$H-NMR measurement, and the number average molecular weight in terms of standard polystyrene by GPC measurement is 68000, the molecular weight of the vinyl group derived from the aromatic polyene unit in the number average molecular weight is 64.8, which is the product of these. The product is divided by 27, which is the formula weight of the vinyl group, to obtain 2.4. That is, the content of vinyl group derived from the aromatic polyene unit per number average molecular weight in the copolymer is 2.4 pieces. The attribution of peaks obtained by $^1$H-NMR measurement of the copolymer is known in literature. Further, a method for obtaining the composition of the copolymer from the comparison of the peak areas obtained by $^1$H-NMR measurement is also known. Further, in the specification, the content of the divinylbenzene unit in the copolymer is determined from the peak intensity of the vinyl group derived from the divinylbenzene unit (according to $^1$H-NMR measurement). That is, from the content of the vinyl group derived from the divinylbenzene unit, the content of the divinylbenzene unit is determined by assuming that one piece of vinyl group is derived from one piece of divinylbenzene unit in the copolymer.

In the copolymer, examples of the olefin-aromatic vinyl compound-aromatic polyene copolymer include an ethylene-styrene-divinylbenzene copolymer, an ethylene-propylene-styrene-divinylbenzene copolymer, an ethylene-1-hexene-styrene-divinylbenzene copolymer, and an ethylene-1-octene-styrene-divinylbenzene copolymer.

Curing Agent

As the curing agent for use in the composition of the present invention such as a curable resin, a known curing agent that may be conventionally used for polymerization or curing of aromatic polyenes and aromatic vinyl compounds may be used. Examples of such a curing agent include a radical polymerization initiator, a cationic polymerization initiator, and an anionic polymerization initiator, and a radical polymerization initiator may be preferably used. Preferably, the curing agent is an organic peroxide-based (peroxide) or azo-based polymerization initiator, which may be freely selected depending on the application and conditions. Catalogs showing examples of organic peroxides may be downloaded from the following NOF CORPORATION websites.

https://www.nof.co.jp/business/chemical/product01a.html
https://www.nof.co.jp/business/chemical/product01b.html
https://www.nof.co.jp/business/chemical/product01c.html Examples of the organic peroxide are also described in the catalogs of FUJIFILM Wako Pure Chemical Corporation and Tokyo Chemical Industry Co., Ltd. The curing agent used in the present invention may be obtained from these companies. Further, a known photopolymerization initiator using light, ultraviolet rays, or radiation may also be used as the curing agent. Examples of the curing agent using the photopolymerization initiator include a photo radical polymerization initiator, a photo cationic polymerization initiator, and a photo anionic polymerization initiator. Such a photopolymerization initiator may be obtained from, for example, Tokyo Chemical Industry Co., Ltd. Furthermore, curing may be performed by radiation or electron beam itself. Alternatively, cross-linking and curing may be performed by thermal polymerization of the raw materials contained without a curing agent.

The amount of the curing agent used is not particularly limited, and in general preferably 0.01 to 10 parts by mass relative to 100 parts by mass of the composition. In the case where a curing agent such as organic peroxide-based (peroxide) or azo-based polymerization initiator is used, the curing treatment is performed at an appropriate temperature and time in consideration of the half-life thereof. The conditions in this case are optional according to the curing agent, and in general, a temperature range of about 50° C. to 180° C. is suitable.

Monomers

The amount of monomers for use in the composition of the present invention is 1 to 500 parts by mass, preferably 1 to 200 parts by mass, relative to 100 parts by mass of the copolymer. With an amount of monomers of 200 parts by mass or less, toughness is easily imparted to the finally resulting cured material, which is preferred. Specifically, the tensile elongation at break of the cured material may be 30% or more, which is preferred. A less amount of monomers is more easily handled to make a thermoplastic composition, and the amount is preferably 30 parts by mass or less, particularly preferably 10 parts by mass or less, relative to 100 parts by mass of the copolymer. Alternatively, the composition may contain substantially no monomers. Monomers that may be suitably used in the composition of the present invention are aromatic vinyl compound monomers, aromatic polyene monomers, and/or polar monomers. The molecular weight thereof is preferably less than 1000, more preferably less than 500. The monomers for favorable use in the composition of the present invention may be any that is cured by various types of curing agent. Monomers that may be polymerized with a radical polymerization initiator are preferred, and aromatic vinyl compounds and aromatic polyenes are more preferred. Further, BVPE (1,2-bis(vinylphenyl)ethane) described in Japanese Patent Laid-Open No. 2003-212941 may also be preferably used. From the viewpoint of enhancing the mechanical strength (elastic modulus) of a cured material at high temperature, the amount of aromatic polyene monomer is preferably 1 part by mass or more and 30 parts by mass or less relative to 100 parts by mass of the copolymer. Further, a relatively small amount of polar monomer may be used for the purpose of imparting adhesiveness to other materials required as an insulating material or improving the cross-linking density. Examples of the above-mentioned polar monomer include various maleimides, bismaleimides, maleic anhydride, glycidyl (meth)acrylate, triallyl isocyanurate (TRIC), tri(meth)acrylic isocyanurate, and trimethylolpropane tri(meth)acrylate. Maleimides and bismaleimides that may be used in the present invention are described in, for example, International Publication No. WO 2016/114287 and Japanese Patent Application Laid-Open No. 2008-291227, and may be purchased from, for example, Daiwa Kasei Industry Co., Ltd. or Designer Molecules Inc. As these maleimide group-containing compounds, bismaleimides are preferred from the viewpoints of solubility in an organic solvent, high frequency properties, high adhesiveness to a conductor, moldability of a prepreg, etc.

As bismaleimides, for example, compounds represented by the following formula (d1) may be used.

Formula (d1)

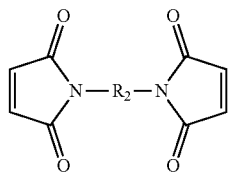
(d1)

wherein $R_2$ represents a divalent organic group having an aromatic ring.

Examples of the compound represented by the formula (d1) include compounds represented by the following formula (d2).

Formula (d2)

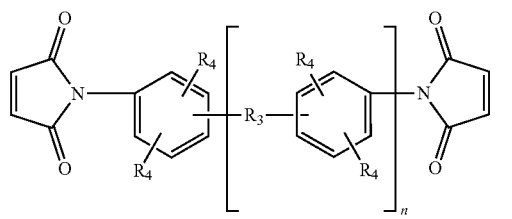
(d2)

wherein $R_3$ represents a single bond or methylene, $R_4$ each independently represent a hydrogen atom or an alkyl group having 1 to 6 carbon atoms, and n is an integer of 0 to 4.

Examples of the compound represented by the formula (d2) include bismaleimide BMI-3000H (m-phenylene bismaleimide) manufactured by Daiwa Kasei Industry Co., Ltd.

Bismaleimides may be used as a polyaminobismaleimide compound. The polyaminobismaleimide compound is obtained, for example, from a Michael addition reaction of a compound having two maleimide groups at a terminal and an aromatic diamine compound having two primary amino groups in a molecule. For obtaining high cross-linking efficiency with a small amount of addition, it is preferable to use a polar monomer having a polyfunctional group containing two or more functional groups, and examples thereof include bismaleimides, triallyl isocyanurate (TRIC), and trimethylolpropane tri(meth)acrylate. The amount of the polar monomer used in the composition of the present invention may be in the range of 0.1 to 10 parts by mass, preferably 0.1 to 5 parts by mass, relative to 100 parts by mass of the copolymer. By using 10 parts by mass or less, the dielectric constant and dielectric tangent of the resulting cured material is reduced. For example, the dielectric constant is less than 3.0 and the dielectric tangent is lower than 0.005.

Additive Resin

The composition of the present invention may contain one or more resins selected from hydrocarbon-based elastomers, polyphenylene ethers, and aromatic polyene-based resins (in the specification, simply referred to as "additive resin"), in a total amount of preferably 1 to 500 parts by mass relative to 100 parts by mass of the copolymer contained.

Hydrocarbon-Based Elastomers

The amount of the hydrocarbon-based elastomer used in the composition of the present invention is preferably 1 to 500 parts by mass, more preferably 1 to 200 parts by mass relative to 100 parts by mass of the copolymer. Hydrocarbon-based elastomers that may be suitably used in the composition of the present invention are one or a plurality of elastomers having a number average molecular weight of 20000 or more, preferably 30000 or more, selected from ethylene-based or propylene-based elastomers, conjugated diene-based polymers, aromatic vinyl compounds-conjugated diene-based block copolymers or random copolymers, and hydrides (hydrogenated product) thereof. The number average molecular weight of the hydrocarbon-based elastomer is 1000 or more, more preferably 2000 or more, still more preferably 20000 or more, and most preferably 30000 or more. The number average molecular weight of the hydrocarbon-based elastomer is preferably 80000 or less, more preferably 60000 or less. Examples of the ethylene-based elastomer include an ethylene-octene copolymer, an ethylene-α-olefin copolymer such as ethylene-1-hexene copolymer, EPR and EPDM, and examples of the propylene-based elastomer include an atactic polypropylene, a polypropylene having low stereoregularity, and a propylene-α-olefin copolymer such as propylene-1-butene copolymer.

Examples of the conjugated diene polymer include polybutadiene and 1,2-polybutadiene. Examples of the aromatic vinyl compound-conjugated diene-based block copolymer or random copolymer, and a hydride (hydrogenated product) thereof include SBS, SIS, SEBS, SEPS, SEEPS, and SEEBS. The 1,2-polybutadiene that may be preferably used may be obtained, for example, as a product of JSR Corporation, or may be obtained as a liquid polybutadiene from Nippon Soda Co., Ltd., under product name of B-1000, 2000 or 3000. Further, examples of the copolymer containing a 1,2-polybutadiene structure that may be preferably used include "Ricon 100" manufactured by TOTAL Cray Valley. In the case where one or a plurality of resins selected from these hydrocarbon-based elastomers are in a liquid state (viscosity: approximately 300000 mPaS or less) at room temperature (25° C.), in particular, the amount thereof used is preferably in the range of 1 to 100 parts by mass, more preferably 1 to 30 parts by mass, particularly preferably 1 to 20 parts by mass relative to 100 parts by mass of the copolymer, from the viewpoint of handleability and moldability (handleability as a thermoplastic resin) of the composition of the present invention in an uncured state.

Polyphenylene Ether

As the polyphenylene ether, a commercially available known polyphenylene ether may be used. The number average molecular weight of the polyphenylene ether is optional, preferably 10000 or less, and most preferably 5000 or less, in consideration of the moldability of the composition. The number average molecular weight is preferably 500 or more, most preferably 1000 or more. Further, in the case of addition for the purpose of curing the composition of the present invention, it is preferable that the molecular end be modified, and/or a plurality of functional groups be contained in one molecule. Examples of the functional group include functional groups such as an allyl group, a vinyl group and an epoxy group, most preferably a radically polymerizable functional group, and a vinyl group, particularly a (meth)acrylic group or an aromatic vinyl group. That is, in the composition of the present invention, a bifunctional polyphenylene ether having a molecular chain modified with radically polymerizable functional groups at both ends is particularly preferred. Examples of such a polyphenylene ether include Noryl (trademark) SA9000 manufactured by SABIC, and a bifunctional polyphenylene ether oligomer (OPE-2St) manufactured by Mitsubishi Gas Chemical Company, Inc. may be particularly preferably used. The amount of the polyphenylene ether used in the composition of the present invention is preferably 1 to 200 parts by mass, more preferably 10 to 100 parts by mass, relative to 100 parts by mass of the copolymer.

Aromatic Polyene-Based Resin

The aromatic polyene-based resin includes a divinylbenzene-based reactive multi-branched copolymer (PDV) manufactured by NIPPON STEEL Chemical & Material Co., Ltd. Such PDV is described, for example, in literature "Synthesis of polyfunctional aromatic vinyl copolymers and development of novel IPN-type low dielectric loss material using the same" (M. Kawabe et al., Journal of The Japan Institute of Electronics Packaging, p. 125, Vol. 12, No. 2 (2009)). Further, examples of the aromatic polyene-based resin also include an aromatic polyene polymer resin containing the above-mentioned aromatic polyene monomer as a main constituent unit.

Solvent (Medium)

An appropriate solvent may be added to the composition of the present invention on an as needed basis. The amount used is not particularly limited. The solvent is used to adjust the viscosity and fluidity of the composition. In particular, in the case where the composition of the present invention is in a varnish form, a solvent is preferably used. The amount used in a varnish is generally in the range of 50 to 1000 parts by mass relative to 100 parts by mass of the copolymer. Examples of the solvent suitably used include cyclohexane, toluene, ethylbenzene, xylene, tetralin, acetone, limonene, mixed alkanes, and mixed aromatic-based solvent.

A less amount of solvent is preferred for the thermoplastic composition. The amount used is preferably less than 1 part by mass relative to 100 parts by mass of the copolymer of the present invention from the viewpoint of moldability and handling of the composition before curing as a thermoplastic resin, and it is more preferable that substantially no solvent be used from the viewpoint of removal during curing and after curing. Substantially no solvent used means preferably 5 parts by mass or less, more preferably 1 part by mass or less, and most preferably 0 parts by mass.

The composition of the present invention may further contain one or more selected from fillers, flame retardants and surface modifiers in the composition. The composition of the present invention comprises one or more selected from these fillers, flame retardants and surface modifiers in order to be a matrix of cured materials and to have excellent filling properties of other materials when cured. Even after curing, the cured material may easily exhibit impact resistance and toughness.

Fillers

Further, a known inorganic or organic filler may be added on an as needed basis. These fillers are added for the purpose of controlling the coefficient of thermal expansion, controlling the thermal conductivity, and reducing the cost, and the amount used thereof is optional depending on the purpose. In particular, in the case of adding an inorganic filler, it is preferable to use a known surface modifier, for example, a silane coupling agent. In particular, for the purpose of producing a composition excellent in low dielectric constant and low dielectric loss, which is one of the objects of the present invention, boron nitride (BN) and/or silica are preferred as the inorganic filler, and fused silica is particularly preferred. From the viewpoint of low dielectric properties, since the dielectric constant may increase high with a large amount of addition or compounding, in particular, the filler in amount of preferably less than 500 parts by mass, more preferably less than 400 parts by mass, relative to 100 parts by mass of the copolymer is used. In order to improve the low dielectric properties (low dielectric constant and low dielectric loss tangent), a hollow filler or a filler having a shape with many voids may be added.

Alternatively, an organic filler such as high molecular weight or ultra-high molecular weight polyethylene may be used instead of inorganic fillers. It is preferable that the organic filler be crosslinked by itself from the viewpoint of heat resistance, and it is preferable that the organic filler be used in a form of fine particles or powder. These organic fillers may suppress the increase in dielectric constant and dielectric tangent. The amount of the organic filler used is preferably 10 to 70 vol %, more preferably 30 to 50 vol %, relative to 100 parts by mass of the composition. The amount of the filler used is most preferably 1 part by mass or more and less than 400 parts by mass relative to 100 parts by mass of the copolymer.

Meanwhile, in the composition of the present invention, a high dielectric constant insulating filler having a dielectric constant at 1 GHz of preferably 3 to 10000, more preferably 5 to 10000, may be mixed and dispersed to prepare an insulating cured material having a high dielectric constant insulating layer having a dielectric constant of preferably 3.1 to 20, with suppressed increase in dielectric tangent (dielectric loss). With increase in the dielectric constant of the film made of insulating cured material, downsizing of a circuit and increase in capacity of a capacitor may be achieved, which contribute to downsizing of electric components for high frequencies. The high dielectric constant and low dielectric tangent insulating layer is suitable for applications such as capacitors, inductors for resonant circuits, filters, and antennas. Examples of the high dielectric constant insulating filler used in the present invention include inorganic fillers and insulated metal particles. Specific examples include known high dielectric constant inorganic fillers such as barium titanate and strontium titanate, and other examples are specifically described in, for example, Japanese Patent Application Laid-Open No. 2004-087639.

Flame Retardant

A known flame retardant may be compounded in the composition of the present invention. Preferred flame retardants are known organic phosphorus-based flame retardants such as phosphoric acid esters or condensates thereof, known bromine-based flame retardants, and red phosphorus, from the viewpoint of maintaining low dielectric constant and low dielectric tangent. In particular, among phosphoric acid esters, a compound having a plurality of xylenyl groups in the molecule is preferred from the viewpoint of flame retardancy and low dielectric tangent property.

In addition to the flame retardants, flame retardant aids including antimony compounds such as antimony trioxide, antimony tetroxide, antimony pentoxide and sodium antimonate, or nitrogen-containing compounds such as melamine, triallyl-1,3,5-triazine-2,3,4-(1H, 3H, 5H)-trione, and 2,4,6-triallyloxy-1,3,5-triazine may be used. In general, the total amount of these flame retardants and flame retardant aids is preferably 1 to 100 parts by mass relative to 100 parts by mass of the composition. Alternatively, 30 to 200 parts by mass of the polyphenylene ether (PPE)-based resin having a low dielectric constant and excellent flame retardancy may be used relative to 100 parts by mass of the flame retardant.

Surface Modifiers

The composition of the present invention may contain various surface modifiers for the purpose of improving adhesion to fillers, copper plates, and wiring. The amount of the surface modifier used is preferably 0.01 to 10 parts by mass, more preferably 0.1 to 5 parts by mass, relative to 100 parts by mass of the composition of the present invention other than the surface modifier. Examples of the surface modifier include various silane coupling agents and titanate-based coupling agents. One or a plurality of various silane coupling agents and titanate-based coupling agents may be used.

In the present invention, by changing the compounding ratio of the copolymer, monomer, additive resin, and solvent on an as needed basis of the composition within the above range, further, by changing the compounding ratio of the flame retardant, filler, and surface modifier, the fluidization temperature of the curable resin or the composition may be adjusted according to the purpose and molding method. Specifically, the composition of the present invention may take product forms including "thermoplastic composition", and "varnish". In the present specification, the term "thermoplasticity" includes preferably the concept of uncured state, but also includes the concept of a semi-cured state (B stage sheet, etc.) or a partially cured state.

As described above, the composition of the present invention may be obtained by mixing/dissolving or melting one or more selected from a copolymer, a curing agent, and on an as needed basis, a monomer, a solvent, an additive resin, a filler, a flame retardant, and a surface modifier. Any known method may be adopted as the method of mixing, dissolving or melting.

Thermoplastic Composition and Molded Product

The composition of the present invention uses a copolymer having a molecular weight in a certain range or more. In the case where a relatively small amount of monomer is contained, the composition contains mainly a copolymer, so that properties of thermoplastic resin may be exhibited. Therefore, under conditions not causing cross-linking, the composition may be molded into a shape such as sheet, tube, strip and pellet, in a substantially uncured state by a known molding method for a thermoplastic resin, and then may be cross-linked (cured). Specifically, the number average molecular weight of the copolymer used in the thermoplastic composition is preferably 20000 or more and 100000 or less, more preferably 30000 or more and 100000 or less. Further, the amount of the monomer used in the thermoplastic composition of the present invention is 10 parts by mass or less relative to 100 parts by mass of the copolymer. Still more preferably, the amount of aromatic polyene monomers such as divinylbenzene or BVPE is 0.3 parts by mass or more relative to 100 parts by mass of the copolymer. In a most preferable case, an aromatic polyene monomer such as divinylbenzene and BVPE is substantially used as the monomer. Further, it is preferable that the thermoplastic composition or the composition contains substantially no solvent. By satisfying all of these conditions, the thermoplastic composition of the present invention may be easily molded as a thermoplastic resin in an uncured state.

The case of the thermoplastic composition of the present invention is described as follows. In the case where a certain ratio or more of the hydrocarbon-based elastomer (excluding resins in liquid state) or polyphenylene ether is contained, moldability as a thermoplastic resin in an uncured state is easy in the same manner. Specifically, the amount of the hydrocarbon-based elastomer (excluding resins in liquid state) and/or polyphenylene ether used relative to 100 parts by mass of the copolymer is preferably in the range of 30 to 200 parts by mass. In this case, the number average molecular weight of the copolymer used is preferably 5000 or more and 100000 or less. The thermoplastic composition is molded into various shapes such as a sheet in advance by taking advantage of the thermoplasticity at a temperature equal to or lower than the working temperature of the curing agent, and may be cured by heating after combining with a semiconductor device, wiring, or a substrate and a laminate, on an as needed basis, so as to achieve adhesion.

In other words, the thermoplastic composition in a preferred embodiment of the present invention is as follows. A molded product or cured material of thermoplastic composition comprises 10 parts by mass or less of monomers relative to 100 parts by mass of an olefin-aromatic vinyl compound-aromatic polyene copolymer satisfying the following conditions (1) to (4), and substantially no solvent. In the following, the cured material refers to, for example, a cured material of molded product.

(1) The number average molecular weight of the copolymer is 20000 or more and 100000 or less;
(2) The aromatic vinyl compound monomer is an aromatic vinyl compound having 8 or more and 20 or less carbon atoms, and the content of the aromatic vinyl compound monomer unit is 10 mass % or more and less than 60 mass %;
(3) The aromatic polyene is one or more selected from polyenes having 5 or more and 20 or less carbon atoms, having a plurality of vinyl groups and/or vinylene groups in the molecule, and the content of the vinyl groups derived from the aromatic polyene unit is 1.5 pieces or more and less than 20 pieces per number average molecular weight; and
(4) The olefin is one or more selected from olefins having 2 or more and 20 or less carbon atoms, being ethylene alone, or having a mass ratio of α-olefin monomer components other than ethylene to an ethylene monomer component contained in the olefin, of $1/10$ or less, more preferably, the content of α-olefin monomer components other than ethylene in the copolymer is 4 mass % or less, and the total of the olefin monomer unit, the aromatic vinyl compound monomer unit, and the aromatic polyene monomer unit is 100 mass %.

Further, the number average molecular weight of the copolymer may be preferably 30000 or more and 100000 or less. In addition, the copolymer may include one or more selected from "curing agent", "additive resin", "filler", "flame retardant", and "surface modifier". Further, the molded product in a sheet form and the cured material of the molded product may be provided. The sheet may be uncured (semi-cured) to an extent that the sheet shape can be maintained, or may be completely cured. The degree of curing of the composition may be quantitatively measured by a known dynamic mechanical analysis (DMA).

Alternatively, the thermoplastic composition in another preferred embodiment of the present invention is as follow. A molded product or cured material of thermoplastic composition comprising 100 parts by mass of an olefin-aromatic vinyl compound-aromatic polyene copolymer satisfying the following conditions (1) to (4), and 1 to 200 parts by mass of one or more resins selected from a hydrocarbon-based elastomer, a polyphenylene ether-based resin, and an aromatic polyene-based resin in total:

(1) The number average molecular weight of the copolymer is 20000 or more and 100000 or less;
(2) The aromatic vinyl compound monomer is an aromatic vinyl compound having 8 or more and 20 or less carbon atoms, and the content of the aromatic vinyl compound monomer unit is 10 mass % or more and less than 60 mass %;
(3) The aromatic polyene is one or more selected from polyenes having 5 or more and 20 or less carbon atoms, having a plurality of vinyl groups and/or vinylene groups in the molecule, and the content of the vinyl groups derived from the aromatic polyene unit is 3 pieces or more and less than 20 pieces per number average molecular weight; and
(4) The olefin is one or more selected from olefins having 2 or more and 20 or less carbon atoms, being ethylene alone, or having a mass ratio of α-olefin monomer components other than ethylene to an ethylene monomer component contained in the olefin, of 1/10 or less, more preferably, the content of α-olefin monomer components other than ethylene in the copolymer is 4 mass % or less, and the total of the olefin monomer unit, and the total of the olefin monomer unit, the aromatic vinyl compound monomer unit, and the aromatic polyene monomer unit is 100 mass %. Further, the number average molecular weight of the copolymer may be preferably 30000 or more and 100000 or less. In addition, the copolymer may include one or more selected from "curing agent", "monomer", "solvent", "filler", "flame retardant", and "surface modifier". Further, the molded product is in a sheet form, and the molded product is made into a cured material.

The composition of the present invention may be provided as a sheet by molding a composition melted by heating at a temperature equal to or less than the working temperature or the decomposition temperature of the curing agent by a known method. Alternatively, the sheet may be molded by extrusion molding with a T-die, double rolling, or extrusion lamination to a base film. In this case, the formulation of the composition and the mass ratio copolymer/monomer, or the solvent, the additive resin, and the flame retardant are selected and adjusted, such that melting is performed at a temperature equal to or less than the working temperature or the decomposition temperature of the curing agent and solidification occurs in the vicinity of room temperature. The sheet in this case is in a substantially uncured state. Then, through various processing and assembling steps, finally, complete curing is performed for a processing time at a temperature equal to or more than the working temperature or the decomposition temperature of the curing agent. Such a method is a general technique used for an ethylene-vinyl acetate resin-based cross-linked sealant sheet of a solar cell (solar power generation device).

Compositions and Molded Products in Semi-Cured State (e.g., B Stage Sheet)

Further, the composition of the present invention may be also made into a molded product such as a sheet and a tube in a partially cross-linked state, for example, with a part of the curing agent contained therein being reacted to a semi-cured state (so-called "B stage state"). For example, semi-curing is achieved by adopting a plurality of curing agents having different curing temperatures and/or curing conditions, so that the melt viscosity and fluidity may be controlled to make the B stage state. That is, by a first stage curing (partial curing), the present curable resin or composition is formed into an easy-to-handle B stage sheet, which is laminated on an electronic device or a substrate to be pressure-bonded. Then, a second stage curing (complete curing) may be performed to obtain a final shape. In this case, the formulation of the composition, that is, the mass ratio copolymer/monomer, is selected, and on an as needed basis, a solvent, an additive resin, and a flame retardant are added. Then, the composition further containing a curing agent such as a peroxide is partially cured and adjusted to a sheet shape (in the B stage state). After a device is molded and assembled, complete curing is performed by heating under pressure. As a method for partially curing the composition, a known method may be adopted. For example, according to the method, peroxides having different decomposition temperatures are used in combination. A semi-cured sheet is obtained through a treatment at a temperature at which only one of them substantially acts for a predetermined time. Finally, through a treatment at a temperature at which all the curing agents act for a sufficient time, complete curing is performed.

Compositions in Varnish Form and Molded Product Thereof

The composition of the present invention may be also in a varnish form in viscous liquid state depending on the composition and compounding ratio. For example, by using a sufficient amount of solvent, a varnish form may be obtained. In particular, for use as a varnish, it is preferable to add an appropriate solvent to the composition of the present invention. The solvent is used to adjust the viscosity and fluidity of the composition as a varnish. A solvent having a boiling point at a certain level or more is preferred, because the solvent having a high boiling point under atmospheric pressure, that is, low volatility, allows a uniform thickness of the applied film to be produced. The preferred boiling point is approximately 130° C. or more and 300° C. or less, under atmospheric pressure. Examples of the solvent suitably used for a varnish include xylene, mesitylene, ethylbenzene, limonene, ethylene glycol methyl ether acetate, ethylene glycol monoethyl ether acetate, and ethylene glycol monobutyl ether. The amount used is preferably in the range of 10 to 2000 parts by mass relative to 100 parts by mass of the composition of the present invention.

A composition in a varnish form of the present invention and a molded product thereof comprise an olefin-aromatic vinyl compound-aromatic polyene copolymer satisfying the following conditions (1) to (4):

(1) The number average molecular weight of the copolymer is 5000 or more and 100000 or less;
(2) The aromatic vinyl compound monomer is an aromatic vinyl compound having 8 or more and 20 or less carbon atoms, and the content of the aromatic vinyl compound monomer unit is 10 mass % or more and less than 60 mass %;
(3) The aromatic polyene is one or more selected from polyenes having 5 or more and 20 or less carbon atoms, having a plurality of vinyl groups and/or vinylene groups in the molecule, and the content of the vinyl groups derived from the aromatic polyene unit is 1.5 pieces or more, preferably 3 pieces or more and less than 20 pieces per number average molecular weight; and
(4) The olefin is one or more selected from olefins having 2 or more and 20 or less carbon atoms, being ethylene alone, or having a mass ratio of α-olefin monomer components other than ethylene to an ethylene monomer component contained in the olefin, of 1/10 or less, more preferably, the content of the α-olefin monomer components other than ethylene in the copolymer is 4 mass % or less, and the total of the olefin monomer unit, the aromatic vinyl compound monomer unit, and the aromatic polyene monomer unit is 100 mass %.

It is preferable that the varnish have a low viscosity to make application and impregnation easy. Accordingly, the preferred number average molecular weight of the copolymer is 5000 or more and 70000 or less.

In addition, the copolymer may include one or more selected from "additive resin", "curing agent", "monomer", "solvent", "filler", "flame retardant", and "surface modifier".

In particular, in the case where the varnish is used with a solvent, it is preferable that the "monomer" used be non-volatile. For example, the varnish having more non-volatility in comparison with the solvent used prevents the monomer from volatilizing together with the solvent in the step of removing the solvent after application of the varnish. As monomers suitable for use as a varnish with solvent, the polar monomers having non-volatility in general are preferred. Examples of the particularly preferred polar monomers include various maleimides and bismaleimides.

The composition in a varnish form of the present invention may also be prepared by utilizing a polymerization solution containing the copolymer of the present invention obtained by polymerization. For example, a polymerization solution may be concentrated or treated to remove residual monomers. On an as needed basis, a solvent, other resin components, various additives, etc. may be added to adjust the component concentration and solution viscosity in the production process.

The varnish may be, for example, applied to a base material, or a base material may be impregnated with the varnish, and the solvent or the like may be removed by drying or the like, so that the varnish may be made into an uncured or semi-cured molded product. Generally, the molded product is in a sheet, film, or tape form.

Curing Process

The thermoplastic composition and molded product, the composition and molded product in a semi-cured state (B-stage sheet, etc.), and the composition and molded product in a varnish form may be cured by a known method by reference to curing conditions (temperature, time and pressure) of the curing agent contained. In the case where the curing agent used is a peroxide, the curing conditions may be determined by reference to the half-life temperature and the like disclosed for each peroxide.

Cured Products Obtained from Compositions

The dielectric constant of the cured material obtained from the copolymer of the present invention is 3.0 or less and 2.0 or more, preferably 2.8 or less and 2.0 or more, particularly preferably 2.5 or less and 2.0 or more, at 10 GHz. The dielectric tangent is 0.005 or less and 0.0003 or more, preferably 0.003 or less and 0.0005 or more. The dielectric constant and dielectric tangent may be obtained by any method known to those skilled in the art, for example, by a resonator method (cavity resonator perturbation method or balanced disk resonator method).

The volume resistivity of the resulting cured material is preferably $1 \times 10^{15}$ Ω·cm or more. These values are preferred values, for example, as an electrically insulating material for high frequencies of 3 GHz or more. Since the copolymer used in the composition of the present invention is relatively soft and has high tensile elongation, the cured material obtained from the composition using the copolymer is relatively soft and has high impact resistance and followability to the thermal expansion of a base material while exhibiting sufficient mechanical properties. That is, the cured material of the present invention has a tensile elastic modulus of less than 3 GPa and 5 MPa or more, preferably 10 MPa or more, more preferably 20 MPa or more, as measured at room temperature (23° C.). Further, in the case where a relatively large amount of filler is compounded, the tensile elastic modulus may take a value of 3 GPa or more and 20 GPa or less. The tensile strength at break is preferably less than 50 MPa and 10 MPa or more, preferably 15 MPa or more, and the tensile elongation at break (tensile breaking elongation) is preferably 30% or more, more preferably 50% or more. In particular, in the case where a relatively large amount of filler is blended, the tensile elongation at break may take a value of less than 30%. The cured material of the composition of the present invention may have sufficient heat resistance for practical use. Specifically, in a prescription for practical aspect, the cured material of the composition of the present invention may have a storage elastic modulus of $5 \times 10^5$ Pa or more, preferably $1 \times 10^6$ Pa or more, and most preferably $1.2 \times 10^6$ Pa or more, at 300° C. Those skilled in the art may easily prepare a cured material by determining the compounding of the composition having the physical property parameters by reference to the information described in the specification and publicly known materials. The cured material obtained from the composition of the present invention has sufficient heat resistance and mechanical properties at high temperature for practical use even under condition with the monomer and the aromatic polyene as monomer component in the composition suppressed to a certain ratio or less. It is important to suppress the monomer and the aromatic polyene as monomer component to a certain ratio or less also for maintaining the moldability as a thermoplastic resin even in the uncured state as described above.

The uncured or semi-cured thermoplastic composition of the present invention may be adhered to a metal foil (copper foil, in general, and any foil of metal such as nickel, aluminum, and iron, or alloy thereof, for use in wiring) for wiring through curing by heating under pressure without application of an adhesive or without adhering treatment. Specifically, a peel strength of 1.0 N/mm or more in the measurement in accordance with the Japanese Industrial Standards (JIS) C6481: 1996 may be imparted in the case where the olefin-aromatic vinyl compound-aromatic polyene copolymer has the content of the aromatic vinyl compound monomer unit of 10 mass % or more, and the olefin is ethylene alone or the mass ratio of the α-olefin monomer component other than ethylene to the ethylene monomer component contained in the olefin is 1/7 or less. More preferably, the peel strength may be further improved to, for example, 1.3 N/mm or more, in the case where the copolymer includes ethylene alone as olefin, or the mass ratio of the α-olefin monomer component other than ethylene to the ethylene monomer component contained in the olefin is 1/10 or less, still more preferably the content of α-olefin monomer component other than ethylene contained in the copolymer is 4 mass % or less. In general, it is known that the dielectric properties of a laminate such as copper-clad laminate are degraded by an adhesive or adhesive treatment. It is therefore preferable that a peel strength of 1.0 N/mm or more be imparted in the measurement in accordance with Japanese Industrial Standards (JIS) C6481: 1996 without such a treatment. As described above, the uncured or semi-cured thermoplastic composition of the present invention may be adhered to the metal foil for wiring by a curing treatment such as heating under pressure, without applying an adhesive or an adhesive treatment. However, in the present invention, with respect to imparting adhesiveness to metal foil and other members, other adhesiveness-imparting measures (application of adhesive, adhesive treatment, etc.) including addition of the "surface modifier" may be implemented without any preclusion.

Metal Foils

The metal foil of the present invention may be any metal foils that may be used for wiring or a substrate, and, for example, a copper foil, aluminum foil, nickel foil, or the like is used. The thickness is not particularly limited, being generally in the range of 1 to 500 μm, preferably 5 to 100 μm. A copper foil usable for high frequency application may be preferably used as metal foil, and any of a rolled copper foil and an electrolytic copper foil may be used. For example, the copper foil may be a copper foil having a surface roughness (maximum height) Rz specified in JIS B0601: 2001 of preferably 5 μm or less, particularly preferably 3 μm or less. Such a copper foil may be obtained from Furukawa Electric Co., Ltd., JX Nippon Mining & Metals Corporation, MITSUI MINING & SMELTING CO., LTD., etc.

General Use of Compositions

The composition of the present invention may be used as various insulating materials for wiring, preferably wiring of high frequency signals, such as coverlays, solder resists, build-up materials, interlayer insulators, bonding sheets, interlayer adhesives, and bumps for flip chip bonders. Further, the composition may be used as an adhesive layer of a base material/substrate such as a single-layer or multi-layer printed circuit board, a flexible printed circuit board, a CCL (copper clad laminate) or FCCL (flexible copper clad laminate) base material.

Method for Producing Laminate Including Copolymer or Composition and Metal Foil, and a Cured Material Thereof The method for producing a laminate including a metal foil and a cured material thereof is not particularly limited, and a known method is used. For example, a cured material of laminate may be obtained by laminating an uncured or B-stage thermoplastic composition and a metal foil by a known method, and heating and pressurizing the laminate under appropriate conditions. Alternatively, a composition in a varnish form may be applied or coated on a metal foil, and on an as needed basis, these may be further laminated and heated to be cured. The laminate may be a laminate including a resin layer containing an olefin-aromatic vinyl compound-aromatic polyene copolymer and a metal foil adjacent to the resin layer. In the case where a solvent is used in the varnish, the solvent may be removed before curing under appropriate conditions and then cured, or the solvent may be removed by heating after curing. Alternatively, curing and removal of the solvent may be performed at the same time. These may be appropriately adjusted by selecting a solvent or monomer having an appropriate vapor pressure and a curing agent having appropriate curing conditions.

Use of Laminate Including Copolymer or Composition and Metal Foil, and Cured Material Thereof The laminate including a metal foil and the cured material thereof of the present invention are used in production of electronic components such as a printed circuit board, a flexible copper-clad laminate with a copper foil laminated to a resin sheet (film), a flexible printed wiring board having an electronic circuit formed on a flexible copper-clad laminate, a flexible printed wiring board with reinforcing plate including a flexible printed wiring board laminated to a reinforcing plate, a multi-layer board including a flexible copper-clad laminate laminated and joined to a flexible printed wiring board, and a flexible flat cable (also referred to as FFC) including a substrate film laminated to a copper wiring. In the present specification, the metal foil or copper foil includes the concept of metal wiring or copper wiring.

Use of Uncured Sheet or Partially Cured Sheet of Composition

The composition of the present invention has high adhesive strength with a metal foil, and may be suitably used as a coverlay, a solder resist, a build-up material, an interlayer adhesive, a buildup film, a bonding sheet, a coverlay sheet, a bump sheet for flip chip bonders, or a potting material. An uncured sheet or partially cured sheet of the composition of the present invention may be suitably used as an electrically insulating material for high frequencies. For example, the sheet may be suitably used as a build-up film, a bonding sheet, a coverlay sheet, a bump sheet for flip chip bonders, or an insulating layer or adhesive layer for substrates. By using the composition as a substitute for the conventionally used epoxy resin or silicone resin, a cured insulating layer or a cured matrix phase having a low dielectric constant and a low dielectric loss may be formed through curing treatment. The thickness of the sheet is generally 1 to 300 microns. The sheet may contain a woven fabric or non-woven fabric of glass cloth or ceramic fiber, may be used for impregnation, or may be multilayered with the fabric. Further, as an antenna cable for mobile phones or the like, a flexible and bendable wiring partially or wholly insulated with the sheet may be used instead of the conventional coaxial cable. For example, using an LCP (liquid crystal polymer), a PPE sheet, a fluororesin, or a polyimide resin as a base material, wiring is coated with the sheet or B stage sheet (coverlay sheet) of the present invention. The sheet is then cured for insulation or cured and adhered to the base material for use as an insulating material.

The metal foil-including laminate having an insulating layer of the cured material obtained by using the composition of the present invention may be a wiring board having a small dielectric loss and excellent high frequency properties. In this case, the merits include heat resistance that may withstand soldering, and a certain degree of softness, elongation, and impact resistance that may withstand stress due to heat cycle or thermal expansion difference, in addition to low dielectric loss. For example, a core material such as a cloth made of glass or quartz, a non-woven fabric, a film material, a ceramic substrate, a glass substrate, a general-purpose resin plate of epoxy and a general-purpose laminated plate, and a conductor foil with an insulating layer made of the cured material may be laminated and pressed to produce the wiring board. Alternatively, a slurry or solution containing the curable composition may be applied to a core material, dried and cured to form an insulating layer. The thickness of the insulating layer is generally 1 to 300 microns. Such a multi-layer wiring board may be multilayered or integrated for use.

The composition or the copolymer of the present invention may be also cured together with an LCP (liquid crystal polymer) layer under relatively mild curing conditions, such that high adhesive strength may be imparted. Here, the LCP layer may be specifically an LCP sheet or film. Therefore, for example, various laminates including an LCP sheet, a metal foil, preferably a copper foil, and the composition of the present invention may be obtained. The number of layers of the laminate and the order of lamination are optional. As such an example in the present invention, the composition of the present invention is useful as an adhesive layer between a metal foil (copper foil) and an LCP sheet. The composition of the present invention may exhibit high adhesiveness to both a metal foil and an LCP sheet. Conventionally, adhesion between an LCP sheet and a copper foil has required heating to the melting point of LCP (approximately 280° C. to 330° C. or a temperature close thereto) and pressure bonding. However, by using the composition of the present invention as an adhesive layer, an LCP and a metal foil may be pressure bonded at a lower temperature substantially in the vicinity of curing temperature of the composition of the present invention. On this occasion, the low dielectric constant and the low dielectric tangent value of the cured material of the composition of the present invention impart usefulness to the laminate as wiring for high-frequency signal transmission, in particular. Another example of the present laminate include a structure for covering metal wiring, preferably copper wiring, arranged on an LCP layer, with a layer of the cured material of the composition of the present invention from the side opposite to the LCP layer side. In other words, the use is a so-called coverlay on an LCP board wiring.

Here, the LCP (liquid crystal polymer) refers to a thermoplastic polymer having a liquid crystal state or optical birefringent properties when melted. Examples of the LCP include a lyotropic liquid crystal polymer that exhibits liquid crystallinity in a solution state and a thermotropic liquid crystal polymer that exhibits liquid crystallinity when melted. The liquid crystal polymer is classified into type I, type II, and type III according to the thermal deformation temperature, and any type may be used. Examples of the liquid crystal polymer include a thermoplastic aromatic liquid crystal polyester, and a thermoplastic aromatic liquid crystal polyester amide having an amide bond introduced into the polyester. The LCP may be a polymer further having an imide bond, a carbonate bond, a carbodiimide bond, or an isocyanurate bond derived from an isocyanate, which is introduced into an aromatic polyester or an aromatic polyester amide. As the LCP, a molten liquid crystal-forming polyester including 2-hydroxy-6-naphthoic acid and parahydroxybenzoic acid, for example, an LCP resin manufactured by UENO FINE CHEMICALS INDUSTRY, LTD. (product number A-5000, melting point: 280° C.), may be used.

The melting point of the LCP is preferably 220 to 400° C., more preferably 260 to 380° C., by the DSC method. With a melting point within the above range, a film or sheet excellent in extrusion moldability and heat resistance may be obtained. Such an LCP may be obtained from, for example, UENO FINE CHEMICALS INDUSTRY, LTD., Sumitomo Chemical Co., Ltd., or POLYPLASTICS CO., LTD. Here, the LCP sheet is a known LCP sheet, and the thickness thereof is optional. The LCP sheet may be obtained by a known method such as a T-die extrusion method, an inflation method, and an endless belt (double belt press) method.

EXAMPLES

Hereinafter, the present invention will be described with reference to Examples, though the present invention is not limited to the following Examples.

The copolymers obtained in synthetic examples and comparative synthetic examples were analyzed by the following means.

The content of vinyl group units derived from ethylene, hexene, styrene, and divinylbenzene in a copolymer was determined by $^1$H-NMR based on the peak area intensity assigned to each. The sample was dissolved in heavy 1,1,2,2-tetrachloroethane, and the measurement was performed at 80 to 130° C.

As molecular weight, the number average molecular weight (Mn) in terms of standard polystyrene was determined by GPC (gel permeation chromatography). The measurement was performed under the following conditions.

In the case where the number average molecular weight is 1000 or more:
Column: Two TSK-GEL Multipore HXL-M having a diameter of 7.8 mm and a length of 300 mm (manufactured by Tosoh Corporation) were connected in series for use.
Column temperature: 40° C.
Solvent: THF
Liquid flow rate: 1.0 ml/min.
Detector: RI detector (differential refractive index detector)

In the case where a copolymer was hardly dissolved in a THF solvent, for example, in the case where an ethylene-styrene-divinylbenzene copolymer had a styrene content of lower than 40 mass %, the molecular weight in terms of standard polystyrene was determined by the following high-temperature GPC method. The measurement was performed under the following conditions.
Apparatus: HLC-8121GPC/HT manufactured by Tosoh Corporation
Column: Three pieces of TSKgelGMHHR-H (20) HT having a diameter of 7.8 mm and a length of 300 mm
Column temperature: 140° C.
Detector: RI
Solvent: ortho dichlorobenzene
Liquid flow rate: 1.0 ml/min
Sample concentration: 0.1 wt/vol %
Sample injection volume: 100 μL DSC Measurement The DSC measurement was performed by using a DSC6200 manufactured by Seiko Instruments Inc. under nitrogen gas flow. That is, 10 mg of resin and 10 mg of α-alumina as reference were heated from room temperature to 240° C. at a heating rate of 10° C./min and then cooled to −120° C. at a rate of 20° C./min by using an aluminum pan under nitrogen atmosphere. After that, DSC measurement was performed while raising the temperature to 240° C. at a heating rate of 10° C./min to determine the glass transition temperature. The glass transition temperature referred to here is the extrapolated glass transition start temperature of JIS K7121: 2012, which is the temperature at the intersection between the straight line extending from the baseline on the low temperature side to the high temperature side and the tangent line drawn at a point where the gradient of the curve of the stepwise change portion of the glass transition is maximized.

Tensile Test

In accordance with JIS K-6251: 2017, a film sheet with a thickness of about 1 mm was cut into the shape of No. 2 dumbbell No. 1/2 type test piece. By using Tensilon UCT-1T manufactured by ORIENTEC CORPORATION, measurement was performed at 23° C. and a tensile speed of 500 ram/min to determine the tensile elastic modulus, the tensile strength at break (breaking strength), and the tensile elongation at break (breaking elongation).

Measurement of Storage Elastic Modulus

Using a dynamic viscoelasticity measuring apparatus (RSA-III manufactured by Rheometric Scientific), measurement was performed at a frequency of 1 Hz in a temperature range of −60° C. to +300° C. A measurement sample (3 mm×40 mm) was cut out from a film having a thickness of about 0.1 mm to 0.3 mm was subjected to measurement for determining the storage elastic modulus. The main measurement parameters related to the measurement are as follows.

Measurement frequency: 1 Hz
Rate of temperature rise: 3° C./min
Measurement length of sample: 13 mm
Test Type=Dynamic Temperature Ramp (DTempRamp)
Initial Static Force: 5.0 g
Auto Tension Sensitivity: 1.0 g
Max Auto Tension Rate: 0.033 mm/s
Max Applied Strain: 1.5%
Min Allowed Force: 1.0 g
Distortion: 0.1%

Coefficient of Water Absorption

Measurement was performed in accordance with ASTM D570-98.

Dielectric Constant and Dielectric Loss (Dielectric Tangent)

A sample with sizes of 1 mm×1.5 mm×80 mm cut out from a sheet of the composition was used for the measurement of the dielectric constant and dielectric tangent of the cured material of the composition by a cavity resonator perturbation method (8722ES type network analyzer manufactured by Agilent Technologies Japan, Ltd., and cavity resonator manufactured by KANTO Electronic Application and Development Inc.), at 23° C. and 10 GHz.

Olefin-Aromatic Vinyl Compound-Aromatic Polyene Copolymer

With reference to the production methods in Japanese Patent Laid-Open No. 2009-161743, Japanese Patent Laid-Open No. 2010-280771 and International Publication No. WO 00/37517, the monomer type, the monomer amount, ratio, polymerization pressure and polymerization temperature were appropriately changed to obtain copolymers P-1 to P-7. The total of the olefin monomer unit (ethylene and 1-hexene), the aromatic vinyl compound monomer unit (styrene), and the aromatic polyene monomer unit (divinylbenzene) was set to 100 mass %. In Table 1, the composition, the number average molecular weight, and the glass transition temperature of the copolymer are shown.

The raw materials are as follows.

As divinylbenzene, divinylbenzene (meta and para mixture, divinylbenzene purity: 81%) manufactured by NIPPON STEEL Chemical & Steel Co., Ltd. was used. As bifunctional polyphenylene ether oligomer (OPE-2St, number average molecular weight: 1200, toluene solution), a powdered polyphenylene ether oligomer for use was obtained by further diluting a product manufactured by Mitsubishi Gas Chemical Company, Inc. with toluene, adding a large amount of methanol thereto to cause methanol precipitation, air-drying, and then drying under reduced pressure. The powder was also used in kneading with a brabender and in preparing a varnish. As SEBS, H-1041 (number average molecular weight: 58000) manufactured by Asahi Kasei Chemicals Corporation was used. As curing agent, Percumyl D (dicumyl peroxide), Perbutyl 0 (t-butylperoxy-2-ethylhexanoate) or Perhexyne 25B (2,5-dimethyl-2,5-bis(t-butylperoxy)hexyne-3), manufactured by NOF CORPORATION was used. As 1,2-polybutadiene, liquid polybutadiene manufactured by Nippon Soda Co., Ltd., product name: B-3000 (number average molecular weight: 3200) was used.

TABLE 1

| Copolymer | Ethylene content mass % | 1-Hexene content mass % | Styrene content mass % | Divinylbenzene vinyl group (Piece per Number average molecular weight) | Number average molecular weight Mn | Glass transition temperature ° C. |
|---|---|---|---|---|---|---|
| P-1 | 46 | 0 | 53 | 2.4 | 68000 | −8 |
| P-2 | 50 | 4 | 45 | 3.5 | 31000 | −30 |
| P-3 | 67 | 0 | 30 | 10.6 | 48000 | −15 |
| P-4 | 59 | 0 | 39 | 5.2 | 36000 | −11 |
| P-5 | 64 | 10 | 25 | 2.4 | 24000 | −47 |
| P-6 | 56 | 22 | 20 | 2.7 | 21000 | −50 |
| P-7 | 38 | 0 | 60 | 4.7 | 27200 | 0 |

TABLE 2

| | Example 1 | Example 2 | Example 3 | Example 4 | Example 5 | Example 6 | Example 7 |
|---|---|---|---|---|---|---|---|
| P-1 | 100 | — | — | — | — | — | — |
| P-2 | — | — | — | 100 | — | — | 100 |
| P-3 | — | 100 | — | — | 100 | 100 | — |
| P-4 | — | — | 100 | — | — | — | — |
| P-5 | — | — | — | — | — | — | — |
| P-6 | — | — | — | — | — | — | — |
| P-7 | — | — | — | — | — | — | — |
| Monomer 1/Styrene | 4 | — | — | — | — | 90 | 90 |
| Monomer 2/Divinylbenzene | 3 | 2 | — | — | — | 10 | 5 |
| Bifunctional polyphenylene ether oligomer (OPE-2St) | — | — | 30 | 50 | — | — | — |
| Tuftec H-1041 (SEBS) | — | — | — | — | 10 | — | — |

TABLE 2-continued

| | | | | | | | |
|---|---|---|---|---|---|---|---|
| 1,2-Polybutadiene | — | — | — | — | 30 | — | — |
| Solvent | — | — | — | — | — | — | — |
| Curing agent | one part by mass* | one part by mass* | one part by mass* | one part by mass* | one part by mass* | one part by mass* | one part by mass* |
| Preparation method of composition | Kneading with brabender | Kneading with brabender | Kneading with brabender | Kneading with brabender | Kneading with brabender | Dissolution by stirring | Dissolution by stirring |
| Properties of composition (room temperature) | Soft resin state | Soft resin state | Soft resin state | Soft resin state | Soft resin state | Varnish state | Varnish state |
| Storage elastic modulus (300° C.)/Pa | $1.1 \times 10^6$ | $2.9 \times 10^6$ | $1.8 \times 10^6$ | $2.0 \times 10^6$ | $1.5 \times 10^6$ | $2.8 \times 10^6$ | $1.3 \times 10^6$ |
| Tensile elastic modulus/MPa | 12 | 25 | 68 | 90 | 35 | 410 | 150 |
| Breaking strength/MPa | >15 | >15 | >15 | >15 | >15 | >15 | >15 |
| Breaking elongation/% | >300 | >300 | >300 | >300 | >300 | 80 | 130 |
| Dielectric constant | 2.2 | 2.1 | 2.1 | 2.4 | 2.3 | 2.3 | 2.2 |
| Dielectric tangent | 0.0011 | 0.0010 | 0.0013 | 0.0015 | 0.0014 | 0.0012 | 0.0013 |
| Coefficient of water absorption/mass % | <0.1 | <0.1 | <0.1 | <0.1 | <0.1 | <0.1 | <0.1 |
| Peel strength from copper foil/N/mm | 1.7 | 2.5 | 2.6 | 1.4 | 2.3 | 2.3 | 1.3 |
| Low temperature brittleness | ○ | ○ | ○ | ○ | ○ | ○ | ○ |

| | Example 8 | Example 9 | Example 10 | Comparative Example 1 | Comparative Example 2 | Comparative Example 3 | Comparative Example 4 |
|---|---|---|---|---|---|---|---|
| P-1 | — | — | — | — | — | — | — |
| P-2 | — | — | — | — | — | — | — |
| P-3 | 100 | — | — | — | — | — | — |
| P-4 | — | 100 | 100 | — | — | — | — |
| P-5 | — | — | — | 100 | — | — | — |
| P-6 | — | — | — | — | 100 | — | — |
| P-7 | — | — | — | — | — | 100 | 100 |
| Monomer 1/Styrene | — | — | — | 20 | 50 | 90 | — |
| Monomer 2/Divinylbenzene | — | — | — | — | 12 | 10 | — |
| Bifunctional polyphenylene ether oligomer (OPE-2St) | 50 | — | 50 | — | — | — | 50 |
| Tuftec H-1041 (SEBS) | 10 | 50 | — | — | — | — | — |
| 1,2-Polybutadiene | 20 | 40 | — | — | — | — | — |
| Solvent | 200 (Mesitylene) | 100 (Mesitylene) | 100 (Mesitylene) | — | — | — | 100 (Mesitylene) |
| Curing agent | one part by mass* | one part by mass* | one part by mass* | one part by mass* | one part by mass* | one part by mass* | one part by mass* |
| Preparation method of composition | Dissolution by stirring | Dissolution by stirring | Dissolution by stirring | Dissolution by stirring | Dissolution by stirring | Dissolution by stirring | Dissolution by stirring |
| Properties of composition (room temperature) | Varnish state | Varnish state | Varnish state | Viscous resin state | Varnish state | Varnish state | Varnish state |
| Storage elastic modulus (300° C.)/Pa | $2.1 \times 10^6$ | $1.3 \times 10^6$ | $2.3 \times 10^6$ | $1.5 \times 10^5$ | $3.0 \times 10^6$ | $2.0 \times 10^6$ | $3.8 \times 10^6$ |
| Tensile elastic modulus/MPa | 160 | 35 | 80 | 1 | 35 | 250 | 110 |
| Breaking strength/MPa | >15 | >15 | >15 | 6 | 7 | >15 | >15 |
| Breaking elongation/% | >300 | >300 | >300 | >300 | 50 | 80 | 230 |
| Dielectric constant | 2.3 | 2.1 | 2.2 | 2.1 | 2.3 | 2.4 | 2.5 |
| Dielectric tangent | 0.0014 | 0.0013 | 0.0014 | 0.0013 | 0.0012 | 0.0012 | 0.0018 |
| Coefficient of water absorption/mass % | <0.1 | <0.1 | <0.1 | <0.1 | <0.1 | <0.1 | <0.1 |
| Peel strength from copper foil/N/mm | 2.0 | 1.5 | 2.6 | 0.37 | 0.1 | 1.1 | 0.78 |
| Low temperature brittleness | ○ | ○ | ○ | ○ | ○ | x | x |

Formulation in table is shown in parts by mass.
*One part by mass was added relative to 100 parts by mass of raw materials other than curing agent in total.

Example 1

In a Brabender Plasti-Corder (PL2000 type manufactured by Brabender GmbH & Co. KG), a resin P-1 (ethylene-styrene-divinylbenzene copolymer) and a monomer kneaded in advance were placed to be kneaded at 100° C., at a rotation speed of 50 rpm for 5 minutes. Further, 1 part by mass of a curing agent (dicumyl peroxide, Percumyl D, manufactured by NOF CORPORATION) was added to 100 parts by mass of the resin and monomer in total (total of raw materials other than curing agent), and the mixture was kneaded under conditions at 100° C., at a rotation speed of 50 rpm, for 5 minutes to prepare a composition. The resulting curable composition was sandwiched between two Teflon (registered trademark) sheets in a mold, closely contacted, sealed, and pressed by a hot press method (120° C., time: 5 minutes, pressure: 1.5 MPa) to obtain sheets (uncured sheets) having various thicknesses (thickness: 1.0 mm, 0.5 mm, etc.). The resulting sheet together with Teflon (registered trademark) sheets was sandwiched between glass plates, closely contacted thereto under load applied, and heat-treated at 120° C. for 30 minutes, 150° C. for 30 minutes, and then at 180° C. for 120 minutes so as to be cured. After curing, the glass plates, Teflon (registered trademark) sheets and the mold were removed to obtain a cured sheet of the composition of the present invention.

Examples 2 to 5

Compositions were prepared according to the same procedure as in Example 1 with the formulations shown in Table 2 (the formulations in the table are shown in parts by mass). However, in Examples 3 and 4, raw materials other than curing agent were kneaded at 120° C., at a rotation speed of 30 rpm for 10 minutes, and then a curing agent was added thereto. Further, kneading was performed under these conditions for 5 minutes. In Example 3, Perhexyne 25B was used as the curing agent. In the same manner as in Example 1, press molding was performed to obtain an uncured sheet. The properties of any of the uncured sheets in Examples 1 to 5 (at room temperature) were in a sheet form in a soft resin state, easy to handle as sheet. After pressing, the sheet peeled off from the Teflon (registered trademark) sheet had low self-adhesiveness, and was able to be handled as a single sheet. Further, in Examples 3 and 4, curing was performed through heat treatments at 120° C. for 30 minutes, at 150° C. for 30 minutes, and then at 200° C. for 120 minutes. In Example 5, 1,2-polybutadiene was added before addition of the curing agent.

Examples 6 to 7, and Comparative Examples 1 to 3

Raw materials other than curing agent were fed into a container provided with a heating/cooling jacket and a stirring blade according to the formulation shown in Table 2, and the mixture was heated to 60° C. and stirred to obtain a composition in a varnish form (viscous state). Then, a curing agent was added, stirred and dissolved. As the curing agent, Perbutyl O was used. The resulting composition in a varnish form was sandwiched between two Teflon (registered trademark) sheets in a mold, closely contacted, and sealed. The composition was then sandwiched between glass plates, closely contacted thereto under load applied, and heat-treated at 80° C. for 12 hours so as to be cured. After curing, the glass plates, Teflon (registered trademark) sheets and the mold were removed to obtain a cured sheet of the composition.

In Comparative Examples 1 and 2, the mass ratio of α-olefin monomer components other than ethylene to an ethylene monomer component contained in the olefin, is more than 1/7. In Comparative Example 3, the content of the aromatic vinyl compound monomer unit is 60 mass % or more.

Examples 8 to 10 and Comparative Example 4

Into a container provided with a heating/cooling jacket and a stirring blade, raw materials other than curing agent were fed according to the formulation shown in Table 2, and the mixture was heated to 60° C. and stirred to obtain a composition in a varnish form (viscous liquid). Then, a curing agent was added, and the mixture was stirred and dissolved. As the curing agent, dicumyl peroxide was used in Examples 8 and 10, and Perhexyne 25B was used in Example 9. Incidentally, in Examples 8 and 9, 1,2-polybutadiene was added before addition of the curing agent. The resulting composition in a varnish form was poured into a mold of Teflon (registered trademark) on a Teflon (registered trademark) sheet, and the solvent was evaporated at about 100° C. with a blower dryer for 6 hours, and then the Teflon (registered trademark) mold was carefully removed to obtain a sheet in a soft resin state. The resulting sheet was sandwiched between two Teflon (registered trademark) sheets in a mold, closely contacted, sealed, and pressed by a hot press method (120° C., time: 5 minutes, pressure: 1.5 MPa) to obtain sheets (uncured sheets) having various thicknesses (thickness: 1.0 mm, 0.5 mm, etc.). The sheet was easy to handle. The sheet peeled off from the Teflon (registered trademark) sheet had low self-adhesiveness, and was able to be handled as a single sheet. In other words, the moldability as a thermoplastic resin in an uncured state was easy. The resulting sheet together with the Teflon (registered trademark) sheet was sandwiched between glass plates, closely contacted thereto under load applied, and heat-treated at 120° C. for 30 minutes, 150° C. for 30 minutes, and then at 180° C. for 120 minutes so as to be cured in Examples 8 and 9. In Examples 10 and Comparative Example 4, the resulting sheet was heat-treated at 120° C. for 30 minutes, 150° C. for 30 minutes, and then at 200° C. for 120 minutes so as to be cured. After curing, the glass plates, Teflon (registered trademark) sheets and the mold were removed to obtain a cured sheet of the composition of the present invention.

In viscoelastic spectrum measurement of the cured materials of the composition sheets obtained in Examples 1 to 10, the elastic modulus was able to be measured without melt fracture even at 300° C., and the storage elastic modulus at 300° C. (573 K) was $5 \times 10^5$ Pa or more, which satisfies the conditions of the present application, and practically $5 \times 10^6$ Pa or more. In addition, any of them had a tensile elastic modulus of less than 3 GPa and 3 MPa or more. Further, any of them had a tensile strength at break of 5 MPa or more, and a tensile elongation at break of 50% or more. The dielectric constant and the dielectric tangent also were in the scope of the present invention. Any of the sheets of cured material obtained in Examples 1 to 10 had a coefficient of water absorption of less than 0.1 mass %. On the other hand, the cured material of the sheet obtained in Comparative Example 1 had a too low tensile elastic modulus at room temperature and a low tensile strength at break. The sheet obtained in Comparative Example 2 had a low tensile strength at break.

Peel Strength from Copper Foil

The copper foil manufactured by MITSUI MINING & SMELTING CO., LTD. (VSP series, TQ-M7-VSP, thickness: 12 μm) was used. On an uncured sheet (thickness: 0.5 mm) obtained in each of Examples 1 to 10, and Comparative Examples 1 to 4, the copper foil was placed. The measurement of peel strength from the copper foil was evaluated by 90° peeling in accordance with Japanese Industrial Standards (JIS) C6481: 1996.

Peel Strength from Roughened Surface of Copper Foil

The copper foil manufactured by MITSUI MINING & SMELTING CO., LTD. (VSP series, TQ-M7-VSP, thickness: 12 μm, surface roughness: 1.1 μm) was used.

On the roughened surface of the copper foil, an uncured sheet (thickness: 0.3 to 0.5 mm) obtained in each of Examples and Comparative Examples (except for Examples 6 and 7, and Comparative Examples 1 to 3) was placed. Using a pressing machine with a mold heated, the sheet and the copper foil were adhered and cured by heating under pressure at a pressure of 5 MPa, at 120° C. for 30 minutes, then 150° C. for 30 minutes, and then 180° C. for 120 minutes so as to obtain a laminate.

On a Teflon sheet on a glass plate, a copper foil with a roughened surface facing up was laminated, and a Teflon (registered trademark) mold (thickness: 0.3 mm) was installed thereon. Into the mold, the composition obtained in each of Examples 6 and 7 and Comparative Examples 1 to 3 were poured. Further, a Teflon sheet and a glass plate were laminated, closely contacted under load applied, and heat-treated at 120° C. for 30 minutes, 150° C. for 30 minutes, and then at 180° C. for 120 minutes for curing. After curing, the glass plate, the Teflon (registered trademark) sheet and the mold were removed to obtain a laminate with the sheet adhered to the copper foil by curing.

Brittle Temperature (Low Temperature Brittleness)

Measurement was performed according to JIS K 7216: 1980. Each of the compositions obtained in Examples 1 to 10 and Comparative Examples 1 to 4 was formed into a B-type test piece for brittleness test, and cured to obtain a sample in the same conditions for the sheet. The brittle temperature of any of the samples was −10° C. or less. The low temperature brittleness is rated as circle (Good) in Table 2. On the other hand, the brittle temperature of the samples obtained in Comparative Examples 3 and 4 was more than −5° C. The low temperature brittleness in Table 2 is rated as X-mark (NG).

Olefin-Aromatic Vinyl Compound-Aromatic Polyene Copolymer

With reference to the production methods in Japanese Patent Laid-Open No. 2009-161743 and Japanese Patent Laid-Open No. 2010-280771, the monomer amount, ratio, polymerization pressure and polymerization temperature were appropriately changed to obtain a copolymer P-8.

The total of the olefin monomer unit (ethylene), the aromatic vinyl compound monomer unit (styrene), and the aromatic polyene monomer unit (divinylbenzene) was set to 100 mass %. In Table 3, the composition, the number average molecular weight, and the glass transition temperature of the copolymer are shown.

TABLE 3

| Copolymer/oligomer | Ethylene content mass % | Styrene content mass % | Divinyl-benzene vinyl group (Piece per Number average molecular weight) | Number average molecular weight Mn | Glass transition temperature ° C. |
|---|---|---|---|---|---|
| P-8 | 48 | 51 | 4.3 | 46000 | −9 |

Example 11

Using P-8, a varnish with toluene as solvent was prepared according to the formulation (parts by mass) shown in Table 4. An uncured sheet in a soft resin state and a cured sheet thereof were prepared in the same manner as in Examples 8 to 10. However, as the polar monomer, bismaleimide BMI-3000H (m-phenylene bismaleimide) manufactured by Daiwa Kasei Industry Co., Ltd., was used. The measured values evaluated in the same manner are shown in Table 4.

Example 12

Using P-8, a varnish with toluene as solvent was prepared according to the formulation (parts by mass) shown in Table 4. An uncured sheet in a soft resin state and a cured sheet thereof were prepared in the same manner as in Examples 8 to 10. However, as a raw material, silica filler SFP-130MC manufactured by Denka Company Limited was used. Relative to 60 vol % of resin component, 40 vol % of silica filler was used. The measured values evaluated in the same manner are shown in Table 4.

TABLE 4

| | Example 11 | Example 12 |
|---|---|---|
| Copolymer P-8 | 100 | 100 |
| Bifunctional polyphenylene ether oligomer (OPE-2St) | — | 50 |
| Bismaleimide (BMI3000H) | 7 | — |
| Solvent (toluene) | 250 | 300 |
| Silica filler (SFP-130MC) | — | ☆40 vol % |
| Curing agent Perhexyne 25B | one part by mass* | one part by mass* |
| Properties of curable resin composition (room temperature) | Soft resin state | Hard resin state |
| Storage elastic modulus (300° C.)/Pa | $1.1 \times 10^6$ | $40 \times 10^6$ |
| Tensile elastic modulus/MPa | 10 | 930 |
| Breaking strength/MPa | 23 | 28 |
| Breaking elongation/% | >300 | 31 |
| Dielectric constant | 2.4 | 2.7 |
| Dielectric tangent | 0.0016 | 0.0019 |
| Coefficient of water absorption/mass % | <0.1 | <0.1 |
| Peel strength from copper foil/N/mm | 2.1 | 1.5 |

Formulation in table is shown in parts by mass.
☆Relative to 60 vol % of resin component, 40 vol %.

Examples 13 and 14

Evaluation as Adhesive Between Copper Foil and LCP (Liquid Crystal Polymer) Sheet Using the varnish obtained in Example 11 and the varnish obtained in Example 12 (varnish before addition of silica filler), the adhesiveness between a copper foil and an LCP sheet was evaluated as follows. The copper foil described above was used as copper foil, and a sheet made of LCP resin manufactured by UENO FINE CHEMICALS INDUSTRY, LTD. (product number A-5000, melting point: 280° C.) having a thickness of 100 μm obtained by the method described in International Publication No. WO 2020/153391 was used as LCP sheet. A varnish was applied onto the LCP sheet, and the solvent was first removed by air drying at 60° C., and then sufficiently and carefully removed under normal pressure to vacuum at 60° C. without foaming. The thickness of the varnish layer after removal of the solvent was about 50 μm. The roughened surface of the copper foil was closely contacted with the varnish side of the sheet from which the solvent had been removed. While applying a pressure of 5 MPa under vacuum with a pressing machine, curing was performed through heat treatment at 120° C. for 30 minutes, 150° C. for 30 minutes, and then at 180° C. for 120 minutes. A sheet having a width of 10 mm and a length of 100 mm was cut out and the measurement of peel strength between the LCP sheet and the copper foil was evaluated by 90° peeling in accordance with Japanese Industrial Standards (JIS) C6481: 1996. In the case of using the varnish obtained in Example 11, the peel strength was 1.7 N/mm. In the case of using the varnish obtained in Example 12 (containing no silica filler), the peel strength was 1.3 N/mm. Through observation of the stripped surface, peeling at the interface between the cured material derived from varnish and the LCP sheet was found, so that it was concluded that the peel strength between the LCP sheet and the cured material derived from varnish were 1.7 N/mm and 1.3

N/mm, respectively. In addition, it was concluded that the peel strength of the copper foil and the cured material derived from varnish were higher than the above values in the same test pieces.

Comparative Example 5

Using only a copper foil and an LCP sheet, pressure thermal bonding was performed with a pressing machine under the same conditions as in Examples 11 and 12. The two did not substantially adhere to each other.

From the above results, the cured material obtained by curing the composition of the present invention has a high elastic modulus under high temperature conditions, and exhibits a specific range of elastic modulus, excellent breaking strength and breaking elongation, a low coefficient of water absorption, and low dielectric properties (low dielectric constant and dielectric tangent). In addition, the peel strength with the copper foil is also practically sufficient. Further, the cured material has low brittle temperature and high cold resistance. Further, high peel strength with an LCP (liquid crystal polymer) sheet is exhibited under relatively mild conditions. Accordingly, the cured material may be suitably used as an electrically insulating material particularly for high frequencies. In particular, the composition of the present invention may be used as a coverlay film, a solder resist film, a build-up film, a bonding sheet, a coverlay sheet, a bump sheet for flip chip bonders, an interlayer insulating agent, and an interlayer adhesive in an uncured state. After lamination or coating application on other components, or impregnation into other components, the composition may be cured for use. The cured composition of the present invention may be used as a printed circuit board, a flexible printed circuit board, and an FCCL (flexible copper clad laminate) base material. Further, it may be used as an insulating layer for a CCL base material and a PCB base material.

The invention claimed is:

1. A laminate, comprising:
    a resin layer containing an olefin-aromatic vinyl compound-aromatic polyene copolymer satisfying the following conditions (1) to (4); and
    a copper foil:
    (1) a number average molecular weight of the copolymer is 31000 or more and 68000 or less;
    (2) an aromatic vinyl compound monomer is a styrene, and a content of a unit of the aromatic vinyl compound monomer is 30 mass % or more and less than 53 mass %;
    (3) an aromatic polyene is divinylbenzene, wherein a content of vinyl groups and/or vinylene groups derived from a unit of the aromatic polyene is 3 pieces or more and less than 11 pieces per number average molecular weight; and
    (4) an olefin is ethylene alone or a combination of ethylene and 1-hexene, wherein a mass ratio of a 1-hexene monomer component to an ethylene monomer component contained in the olefin is 1/7 or less, a content of a unit of the olefin monomer is in a range of 46 to 67 mass %, and a total of units of the olefin, the aromatic vinyl compound monomer, and the aromatic polyene in the copolymer is 100 mass %.

2. The laminate according to claim 1, further comprising an LCP (liquid crystal polymer) layer.

3. The laminate according to claim 1, wherein the resin layer further contains 0.001 to 5 parts by mass of a curing agent relative to 100 parts by mass of the copolymer.

4. The laminate according to claim 1, wherein the resin layer further contains 1 to 500 parts by mass of one or more additive resins selected from the group consisting of a hydrocarbon-based elastomer, a polyphenylene ether-based resin, and an aromatic polyene-based resin in total relative to 100 parts by mass of the copolymer.

5. The laminate according to claim 1, wherein the resin layer further contains 1 to 500 parts by mass of one or more monomers selected from the group consisting of an aromatic vinyl compound monomer, an aromatic polyene monomer, and a polar monomer relative to 100 parts by mass of the copolymer.

6. The laminate according to claim 5, wherein the aromatic polyene monomer is present in an amount of 1 part by mass or more relative to 100 parts by mass of the one or more monomers.

7. The laminate according to claim 1, further comprising one or more selected from the group consisting of a filler, a flame retardant, and a surface modifier.

8. A cured material of the laminate according to claim 1.

9. An olefin-aromatic vinyl compound-aromatic polyene copolymer satisfying the following conditions (1) to (4):
    (1) a number average molecular weight of the copolymer is 31000 or more and 68000 or less;
    (2) an aromatic vinyl compound monomer is a styrene, and a content of a unit of the aromatic vinyl compound monomer is 30 mass % or more and less than 53 mass %;
    (3) an aromatic polyene is divinylbenzene, wherein a content of vinyl groups and/or vinylene groups derived from a unit of the aromatic polyene is 3 pieces or more and less than 11 pieces per number average molecular weight; and
    (4) an olefin is ethylene alone or a combination of ethylene and 1-hexene, wherein a mass ratio of a 1-hexene monomer component to an ethylene monomer component contained in the olefin is 1/7 or less, a content of a unit of the olefin monomer is in a range of 46 to 67 mass %, and a total of units of the olefin, the aromatic vinyl compound monomer, and the aromatic polyene in the copolymer is 100 mass %.

10. A composition comprising:
    the copolymer according to claim 9, and
    0.001 to 5 parts by mass of a curing agent relative to 100 parts by mass of the copolymer.

11. A composition comprising:
    the copolymer according to claim 9, and
    one or more additive resins selected from the group consisting of a hydrocarbon-based elastomer, a polyphenylene ether-based resin and an aromatic polyene-based resin in a total amount of 1 to 500 parts by mass relative to 100 parts by mass of the copolymer.

12. A composition comprising:
    the copolymer according to claim 9, and
    one or more monomers selected from the group consisting of an aromatic vinyl compound monomer, an aromatic polyene monomer, and a polar monomer, in an amount of 1 to 500 parts by mass relative to 100 parts by mass of the copolymer.

13. The composition according to claim 12, wherein the aromatic polyene monomer is present in an amount of 1 part by mass or more relative to 100 parts by mass of the one or more monomers.

14. The composition according to claim 10, further comprising one or more selected from the group consisting of a filler, a flame retardant, and a surface modifier.

15. A cured material obtained by curing the copolymer according to claim 9.

16. A cured material obtained by curing the composition according to claim 10.

\* \* \* \* \*